(12) United States Patent
Son et al.

(10) Patent No.: US 7,863,207 B2
(45) Date of Patent: Jan. 4, 2011

(54) GLASS FRIT AND SEALING METHOD FOR ELEMENT USING THE SAME

(75) Inventors: Jung-Hyun Son, Hwaseong (KR); Sang-Kyu Lee, Hwaseong (KR); Han-Bok Joo, Hwaseong (KR); Jong-Dai Park, Hwaseong (KR)

(73) Assignee: Dongjin Semichem Co., Ltd., Gajwa-Dong, Seo-Gu, Incheon (KR)

( * ) Notice: Subject to any disclaimer, the term of this patent is extended or adjusted under 35 U.S.C. 154(b) by 319 days.

(21) Appl. No.: 12/202,455

(22) Filed: Sep. 2, 2008

(65) Prior Publication Data

US 2009/0064717 A1    Mar. 12, 2009

(30) Foreign Application Priority Data

Sep. 10, 2007    (KR) .................. 10-2007-0091367

(51) Int. Cl.
*C03C 8/08* (2006.01)
*C03C 8/14* (2006.01)
*C03C 8/16* (2006.01)
*C03C 8/24* (2006.01)
*C03C 3/21* (2006.01)
*C03B 23/00* (2006.01)
*B29C 65/16* (2006.01)
*H01J 9/26* (2006.01)

(52) U.S. Cl. .............. 501/24; 501/15; 501/17; 501/20; 501/46; 501/47; 156/275.5; 65/36; 65/43; 65/58; 445/44; 313/504

(58) Field of Classification Search .......... 501/15, 501/17, 20, 24, 46, 47; 156/89.11, 275.3, 156/275.5, 275.7; 65/36, 43, 58; 445/23, 445/25, 44; 313/504, 506, 512, 498
See application file for complete search history.

(56) References Cited

U.S. PATENT DOCUMENTS

| 3,885,975 | A | * | 5/1975 | Malmendier et al. .......... 501/41 |
| 5,346,863 | A | * | 9/1994 | Hikata et al. .................. 501/17 |
| 2007/0090759 | A1 | * | 4/2007 | Choi et al. .................... 313/512 |
| 2007/0194710 | A1 | * | 8/2007 | Song et al. .................... 313/512 |
| 2009/0065049 | A1 | * | 3/2009 | Son et al. ...................... 136/256 |
| 2009/0068917 | A1 | * | 3/2009 | Kim ............................. 445/25 |
| 2009/0136766 | A1 | * | 5/2009 | Son et al. ...................... 428/432 |

\* cited by examiner

*Primary Examiner*—Karl E Group
*Assistant Examiner*—Elizabeth A Bolden
(74) *Attorney, Agent, or Firm*—Lexyoume IP Group, PLLC.

(57) ABSTRACT

The present invention relates to a glass frit and a sealing method for an electric element using the same, and more particularly, to a glass frit which provides a good sealing effect to moisture and gas and is processable at low temperatures, and a sealing method for an electric element using the same.

11 Claims, 1 Drawing Sheet

GLASS FRIT AND SEALING METHOD FOR ELEMENT USING THE SAME

CROSS-REFERENCE TO RELATED APPLICATION

This application claims priority from Korean Patent Application No. 2007-0091367, filed on Sep. 10, 2007 in the Korean Intellectual Property Office, the disclosure of which is incorporated herein by reference.

BACKGROUND OF THE INVENTION

1. Field of the Invention

The present invention relates to a glass frit, and more particularly, to a glass frit which has a good sealing effect with respect to moisture and gas and is processable at low temperatures, and a sealing method for an electric element using the same.

2. Description of the Related Art

Electric elements such as organic light emitting diodes, dye-sensitive solar cells and LEDs are required to be tightly sealed to minimize impacts from external moisture and gas and to improve performance and life thereof.

Particularly, there have been considerable studies about OLEDs in recent years as they can potentially apply to various areas and electroluminescent devices. For example, a single OLED can be used in a discrete light emitting device while an array of OLEDs can be applicable to an optical or flat panel display (e.g., OLED display). A typical OLED display has good contrast and a wide viewing angle. However, the OLED display, and particularly, an electrode and an organic layer included in the OLED can easily deteriorate by responding to oxygen and moisture in the OLED display. It is well known that the life of the OLED display may sharply rise if the electrode and organic layer within the OLED display are tightly sealed from the surrounding environment.

However, the size of the tight sealing should be as minimum as possible (e.g., <2 mm) in providing a barrier to oxygen ($10^{-3}$ cc/m$^2$/day) and water ($10^{-6}$ g/m$^2$/day). Also, the temperatures generated during the sealing process should not damage materials (e.g. electrodes and organic layers) within the OLED display as well as gas emitted during the operation should not contaminate the materials within the OLED display. As an electric connector (e.g., thin film chromium) should be within the OLED display, it was very difficult in the past to develop a sealing process to tightly seal the OLED display.

A general method of sealing the OLED display is to use epoxide, inorganic and/or organic materials forming the sealing after being processed with UV. For example, Vitex manufactures a coating agent named Barix™, which can be used to seal the OLED display with the inorganic and organic materials, based on access. Such a sealing method provides good physical intensity while it may not be cost effective. Also, there are many examples that diffusion of oxygen and moisture to the OLED display is not prevented.

Another method of sealing the OLED display is to use metal welding or soldering. In this case, there is a substantial difference between CTEs of a glass plate and metal in the OLED display, thereby failing to provide durability at a wide range of temperatures.

Thus, there have been continuous demands for addressing the foregoing problems and other weaknesses related to the typical sealing method for the OLED display. For example, Korean Patent First Publication No. 2006-0005369 discloses a method of tightly sealing an OLED element with a glass frit.

Still, there have been requests for developing a more efficient sealing method for an electric element such as OLED, dye-sensitive solar cell, LED, etc. which are greatly affected by moisture and gas like oxygen.

SUMMARY OF THE INVENTION

Accordingly, it is an aspect of the present invention to provide a glass frit which has a good sealing effect with respect to moisture and gas and is processable at low temperatures, and a glass frit paste composition comprising the same.

Also, it is another aspect of the present invention to provide a sealing method for an electric element using the glass frit paste composition, and an electric element tightly sealed by the sealing method.

Additional aspects and/or advantages of the present invention will be set forth in part in the description which follows and, in part, will be obvious from the description, or may be learned by practice of the present invention.

The foregoing and/or other aspects of the present invention are also achieved by providing a glass frit comprising $P_2O_5$ of 10 to 25 mol %; $V_2O_5$ of 40 to 50 mol %; ZnO of 10 to 20 mol %; BaO of 1 to 15 mol %; $Sb_2O_3$ of 1 to 10 mol %; $Fe_2O_3$ of 1 to 10 mol %; $Al_2O_3$ of 0.1 to 5 mol %; $B_2O_3$ of 0.1 to 5 mol %; $Bi_2O_3$ of 1 to 10 mol %; and $TiO_2$ of 0.1 to 5 mol %.

The foregoing and/or other aspects of the present invention are also achieved by providing a glass frit paste composition, comprising a) a glass frit according to one of claims 1 to 3; b) an organic binder; and c) an organic solvent.

The foregoing and/or other aspects of the present invention are also achieved by providing a sealing method for an electric element which is manufactured by sealing at least two substrates, the sealing method comprising printing the glass frit paste composition on a predetermined position of a substrate to be sealed; and sealing the substrate by firing the glass frit paste composition printed by laser.

The foregoing and/or other aspects of the present invention are also achieved by providing an electric element which is tightly sealed by the sealing method.

BRIEF DESCRIPTION OF THE DRAWINGS

The above and/or other aspects of the present invention will become apparent and more readily appreciated from the following description of the embodiments, taken in conjunction with the accompanying drawings of which.

DETAILED DESCRIPTION OF EXEMPLARY EMBODIMENT

Figure 1:
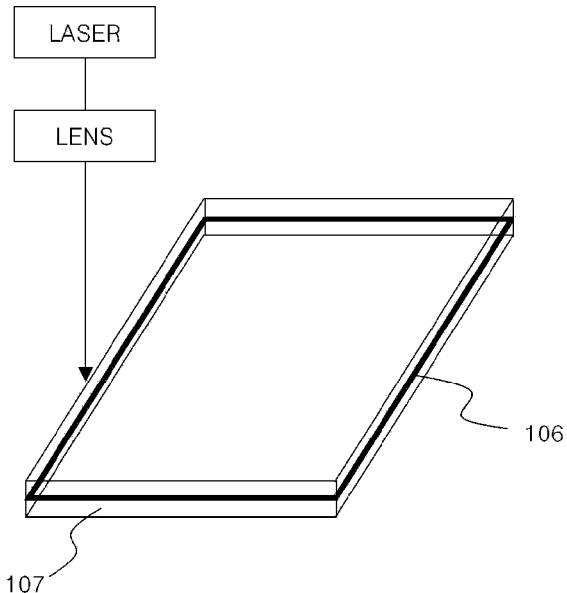
FIG. 1 illustrates a sealing method for an electric element using a glass frit paste composition according to the present invention; (106: glass frit, 107: lower substrate)

Hereinafter, exemplary embodiments of the present invention will be described with reference to accompanying drawings, wherein like numerals refer to like elements and repetitive descriptions will be avoided as necessary.

Hereinafter, the present invention will be described in detail.

A glass frit according to the present invention includes $P_2O_5$ of 10 to 25 mol %; $V_2O_5$ of 40 to 50 mol %; ZnO of 10 to 20 mol %; BaO of 1 to 15 mol %; $Sb_2O_3$ of 1 to 10 mol %; $Fe_2O_3$ of 1 to 10 mol %: $Al_2O_3$ of 0.1 to 5 mol %; $B_2O_3$ of 0.1 to 5 mol %; $Bi_2O_3$ of 1 to 10 mol %; and $TiO_2$ of 0.1 to 5 mol %, and more preferably, includes $P_2O_5$ of 15 to 20 mol %; $V_2O_5$ of 40 to 50 mol %; ZnO of 10 to 20 mol %; BaO of 5 to 10 mol %; $Sb_2O_3$ of 3 to 7 mol %; $Fe_2O_3$ of 5 to 10 mol %: $Al_2O_3$ of 0.1 to 5 mol %; $B_2O_3$ of 0.1 to 5 mol %; $Bi_2O_3$ of 1 to 5 mol %; and $TiO_2$ of 0.1 to 5 mol %.

If the content of the foregoing components in the glass frit according to the present invention is out of the range, vitrification does not occur, water-resistance is drastically lowered or laser firing does not occur.

Particularly, if the content of ZnO is less than 10 mol %, a thermal expansion coefficient increases and sealing is not available. Meanwhile, if the content of ZnO exceeds 20 mol %, crystal is precipitated and the sealing is unavailable. If the content of BaO is less than 1 mol % based on the total composition, a softening point rises. Meanwhile, if the content of BaO exceeds 15 mol %, glass may become unstable, causing devitrification.

If $Al_2O_3$ in the frit composition is less than 0.1 mol %, water-resistance deteriorates. Meanwhile, if $Al_2O_3$ exceeds 5 mol %, glass becomes unstable. If the content of $B_2O_3$ is less than 0.1 mol %, crystal is precipitated. If the content of $B_2O_3$ exceeds 5 mol %, the softening temperature exceeds 500° C. and low temperature sealing is not possible.

If the content of $Bi_2O_3$ is less than 1 mol %, a softening temperature of a mother glass is 500° C. and more, which may not be used as a sealing material. If the content of $Bi_2O_3$ exceeds 10 mol %, a thermal expansion coefficient increases and the sealing is not possible. If the content of $TiO_2$ is less than 0.1 mol %, resistance to acid is lowered. If the content of $TiO_2$ exceeds 5 mol %, the thermal expansion coefficient increases and a low temperature sealing may not be available.

Preferably, the glass frit according to the present invention including the foregoing components has a glass transition temperature (Tg) of 300 to 400° C. and a softening temperature of 300 to 400° C. If the temperatures are within the range, the glass frit has good firing stability at low temperatures.

The glass frit according to the present invention having the foregoing components may have a particle size of 0.1 to 20 μm. If the size is within the range, low temperature processing is available and the glass frit may be appropriate for tightly sealing an element weak to heat. Also, laser processing is available and sealing efficiency of the electric element may be raised.

The present invention further provides a glass frit paste composition comprising the glass frit to seal an electric element. The glass frit paste composition includes a) the glass frit, b) an organic binder and c) an organic solvent. Preferably, the glass frit paste composition includes a) the glass frit of 60 to 90 wt %, b) the organic binder of 0.1 to 5 wt % and c) the organic solvent of 5 to 35 wt %.

The a) glass frit included in the glass frit paste composition according to the present invention is the same as that described above while the b) organic binder may be a commercial organic binder. More specifically, the organic binder may include e.g., ethyl cellulose or acrylic copolymers. The c) organic solvent may include an organic solvent compatible with the organic binder of the glass frit paste composition according to the present invention. More specifically, if the organic binder is ethyl cellulose, the organic solvent may include e.g., butylcarbitolacetate (BCA), terpineol (TPN) or dibutyl phthalate (DBP) or at least two thereof may be used. Preferably, after the organic binder is mixed with the organic solvent of 30 to 70 wt % among the used organic solvent of 100 wt % to manufacture a vehicle, the remaining organic solvent and the glass frit are mixed with the manufactured vehicle to make a glass frit paste composition. In this case, dispersibility of the glass frit paste composition may further improve. More preferably, in manufacturing the vehicle, the organic solvent of 30 to 70 wt % may include BCA of 20 to 55 wt %, TPN of 3 to 10 wt % and DBP of 1 to 5 wt %. If mixed with the glass frit, the used solvent may include BCA.

The glass frit paste composition according to the present invention may further include a filler to adjust a thermal expansion coefficient. More specifically, the filler may include a cordierite of 0.1 to 20 μm, and the content thereof may be 0.1 to 30 wt %.

Preferably, the glass frit paste composition according to the present invention has a viscosity of 500 to 50,000 cps, and more preferably, 2,000 to 35,000 cps. If the viscosity is within the range, the glass frit paste composition may be applied by a screen printing to thereby further improve workability.

Also, the present invention provides a sealing method for an electric element using the glass frit paste composition. The sealing method for the electric element according to the present invention may include typical processes of a sealing method for an electric element except that the glass frit paste composition is used.

More specifically, a sealing method for an OLED element as an example of the sealing method for the electric element according to the present invention may have following processes.

After an OLED lower member is prepared, OLED is deposited on a lower substrate according to a known method. After an OLED upper member is prepared, the glass frit paste composition is deposited on an upper substrate. The lower and upper members may include glass substrates, e.g., transparent glass members (Eagle 2000 manufactured by Samsung Corning Co., Ltd). Preferably, the glass frit paste composition is deposited on the upper substrate by a screen printing. The glass frit paste composition may be firmly attached to the upper substrate by free-sintering. After providing the upper substrate having the frit glass paste composition on the lower substrate having the OLED, laser is emitted to the glass frit paste to melt the glass frit. Then, the upper and lower substrates are connected to each other and tightly seal the OLED element.

More preferably, as shown in FIG. 1, a photo-curable light transparent composition is applied across a surface of the lower substrate or the upper substrate having the glass frit paste composition and a getter composition, and then the upper and lower sealing members applied with the photo-curable light transparent composition are connected to each other. Then, light is emitted to the connected upper and lower sealing members to cure the photo-curable light transparent composition. Finally, laser is emitted to the glass frit paste composition and the getter composition to melt them and connect the lower and upper substrates. Then, the OLED element may be tightly sealed. The photo-curable light transparent composition may include i) aromatic epoxy resin, cyclic epoxy resin or epoxy resin as a mixture of the aromatic epoxy resin and cyclic epoxy resin of 100 wt %, ii) a photo initiator of 0.01 to 20 wt % and iii) a coupling agent of 0.01 to 10 wt %. The photo-curable light transparent composition may have a light transmittance of 90 to 99% and a viscosity of 500 to 50,000 cps if being cured, and preferably further include a photo-acid generator of 0.05 to 10 wt % or an inorganic filler of 0.1 to 100 wt %. The getter composition may include the glass frit of 1 to 90 wt %, getter powder of 1 to 90 wt %, organic vehicle of 1 to 80 wt % and a solvent of 0 to 30 wt %. The getter powder may include zeolite, aluminum oxide, silica, alkali metal salt or alkaline earth metal oxide. The organic vehicle may include an organic solvent mixed with a binder such as ethyl cellulose of 1 to 10 wt %. The solvent includes an organic solvent. If the photo-curable light transparent composition and getter composition are used as described above, a light emitting layer and an electrode are protected by a curing solution of the photo-curable light transparent composition to thereby prevent errors due to contact of light emitters of the upper and lower sealing members. Also, workability of the display element sealing improves and moisture resistance and adhesion are excellent. Also, top emission is available and an aperture ratio of the display element improves. As light is emitted to the top, an area of the light emitting part may be extended without being disturbed by TFT, capacitor and wires. As light is not necessarily emitted to a lower electrode layer (anode), the substrates do not need to be transparent and can employ a thin substrate such as stainless steel.

The present invention further provides an electric element tightly sealed by the sealing method. More specifically, the electric element may include e.g., an OLED, a dye-sensitized solar cell, an LED, a sensor or other optical devices. As glass frit which is proper to lower temperature processing is used, negative impact to the element may be minimized and sealing effect to moisture and gas may sharply improve.

Hereinafter, exemplary embodiments of the present invention are provided to help understand the present invention. However, the present invention is not limited to following exemplary embodiments.

Exemplary Embodiment 1

Fabrication of Glass Frit

With composition as in Table 1, a glass frit according to exemplary embodiments 1 and 2 and comparative embodiments 1 to 4 was made. The unit in Table 1 is mol %.

In the comparative embodiment 1 in Table 1, the composition did not form a glass frit. In the exemplary embodiments 1 and 2 and comparative embodiments 2 to 4, a glass frit of 0.1 to 20 μm was made.

Exemplary Embodiments 3 and 4 and Comparative Embodiments 5 to 7

Fabrication of Glass Frit Paste Composition

A glass frit paste composition was made by using the glass frit according to the exemplary embodiments 1 and 2 and comparative embodiments 2 to 4. To make the glass frit paste composition, ethyl cellulose organic binder of 5 wt % was melted by a mixture solvent including BCA:TPN:DBP at a ratio of 75:15:5 to make a vehicle. Then, the vehicle of 17 wt %, BCA as an organic solvent of 12 wt % and glass frit of 71 wt % according to the exemplary embodiments 1 and 2 and comparative embodiments 2 to 4 were mixed, respectively, to make a glass frit paste composition according to the exemplary embodiments 3 and 4 and comparative embodiments 5 to 7.

A sealing test of an OLED display was performed by using the glass frit paste composition according to the exemplary embodiments 3 and 4 and comparative embodiments 5 to 7. The OLED element was sealed by a method disclosed in Korean Patent First Publication No. 2006-0005369. That is, the glass frit paste composition according to the exemplary embodiments 3 and 4 and comparative embodiments 5 to 7 was screen printed, dried, free-fired and received laser to seal the OLED display. The laser included a Ti:sapphire laser emitting 810 nm while the substrate included a transparent glass material (Eagle 2000 manufactured by Samsung Corning Co. Ltd.). During the sealing process, there was no distinct temperature rises or cracking from a glass plate.

The glass frit and the glass frit paste composition according to the exemplary embodiments and comparative embodiments were measured and the result was shown in Table 2.

1. Glass Transition Temperature (Tg)

The glass transition temperature was measured by raising the temperature 10° C./min with a DTA (DTG-60H Shimatz).

2. Softening Temperature (Tdsp)

The softening temperature was measured by raising the temperature 10° C./min with a DTA (DTG-60H Shimatz).

3. Thermal Expansion Coefficient (CTE($\times 10^{-7}$/° C.)

The thermal expansion coefficient was measured by raising the temperature 5° C./min with a TMA (TMA-Q400 TA instrument).

TABLE 1

|  | Exemplary Embodiment 1 | Exemplary Embodiment 2 | Comparative embodiment 1 | Comparative embodiment 2 | Comparative embodiment 3 | Comparative embodiment 4 |
|---|---|---|---|---|---|---|
| $P_2O_5$ | 18.2 | 18.2 | 0 | 10 | 30 | 5 |
| $V_2O_5$ | 42.7 | 42.7 | 60 | 45 | 50 | 50 |
| ZnO | 13.6 | 11.1 | 10 | 20 | 20 | 20 |
| BaO | 9.1 | 9.1 | 20 | 20 | 0 | 20 |
| $Sb_2O_3$ | 5.7 | 4.3 | 0 | 0 | 0 | 0 |
| $Fe_2O_3$ | 5.7 | 9.6 | 0 | 0 | 0 | 0 |
| $Al_2O_3$ | 0.9 | 0.9 | 5 | 0 | 0 | 0 |
| $B_2O_3$ | 0.9 | 0.9 | 0 | 0 | 0 | 0 |
| $Bi_2O_3$ | 2.3 | 2.3 | 0 | 0 | 0 | 0 |
| $TiO_2$ | 0.9 | 0.9 | 0 | 0 | 0 | 0 |
| $SiO_2$ | 0 | 0 | 5 | 0 | 0 | 0 |
| $Na_2O$ | 0 | 0 | 0 | 0 | 0 | 0 |
| MgO | 0 | 0 | 0 | 5 | 0 | 5 |

4. Water Resistance

After dipping the sealed OLED piece into 80° C. pure water for 24 hours, the weight of the OLED piece was measured. If the increase and decrease rate of the weight is less than 0.5%, it was marked in O. If the increase and decrease rate is 0.5% and more, it was marked in X.

5. Firing Stability

Glass frit powder was filled in a metal mold and pressed. After raising the temperature 10° C./min to 600° C. and firing the glass frit powder, it was examined whether crystallization occurred. ⊚: No crystallization and excellent gloss, ○: No crystallization and good gloss, X: Crystallization occurred and no gloss.

TABLE 2

|  | Exemplary Embodiment 3 | Exemplary Embodiment 4 | Comparative embodiment 5 | Comparative embodiment 6 | Comparative embodiment 7 |
|---|---|---|---|---|---|
| Tg(° C.) | 322 | 332 | 348 | 352 | 342 |
| Tdsp(° C.) | 344 | 339 | 356 | 365 | 359 |
| CTE(×10⁻⁷/° C.) | 75 | 75 | 81 | 81 | 81 |
| Water resistance | ○ | ○ | ○ | X | ○ |
| Firing stability | ⊚ | ⊚ | X | ○ | X |

As shown in Table 2, the glass frit paste composition according to the present invention provides good water resistance and firing stability.

Sealing OLED Element According to Exemplary Embodiment 5

Figure 2:
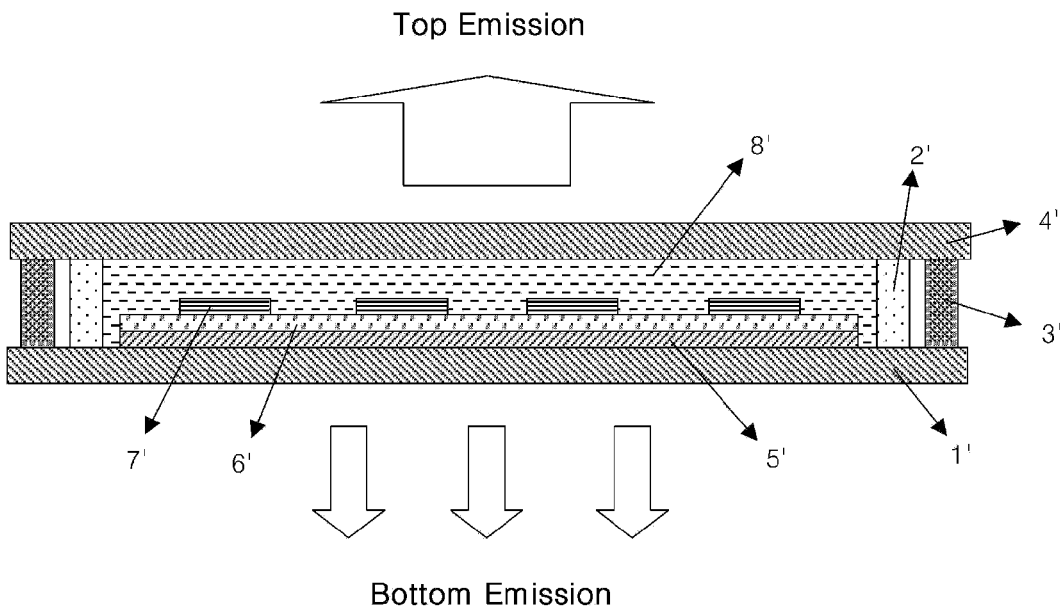
FIG. 2 illustrates an OLED element sealed by a sealing method according to an exemplary embodiment 5 of the present invention. (1': lower glass substrate, 2': getter, 3': glass frit, 4': upper glass substrate, 5': anode, 6': light emitting layer, 7' : cathode, 8' : photo-curable light transparent composition)

A lower sealing member having an anode, a light emitting layer and a cathode, sequentially, and an upper sealing member having the glass frit paste composition according to the exemplary embodiment 3 and the getter were provided on a lower substrate. The getter was formed by using the glass frit according to the present invention of 8 wt %, zeolite (molecular sieve) as getter powder of 32 wt %, and organic vehicle of 60 wt % including ethyl cellulose of 5 wt % and an organic solvent in remaining amount and then by screen printing them. A photo-curable light transparent composition was applied to the surface of the upper sealing member by screen printing. The photo-curable light transparent composition was made by mixing bisphenol A type epoxy resin (Epikote 983U made by Japan Epoxy) of 100 wt %, a cationic polymerization initiator (adecaoptomer SP-170 made by Asahidenca) of 3 wt % and a silane coupling agent (KBM403 made by Shinetz) of 0.1 wt %, agitating and deaerating them. After connecting the upper and lower sealing members having the photo-curable light transparent composition in a vacuum atmosphere of $10^{-7}$ torr under nitrogen atmosphere, UV of 6000 mJ/cm² was emitted to cure the photo-curable light transparent composition. As shown in FIG. 2, the getter and glass frit formed in a sealing pattern was sealed by laser.

While a gap between the upper and lower sealing members was empty in the conventional art, they were tightly connected to each other by the glass frit, getter and photo-curable light transparent composition as in FIG. 2.

A glass frit and a sealing method for an electric element using the same according to the present invention provides a good sealing effect to moisture and gas, and is processable at low temperatures.

Although a few exemplary embodiments of the present invention have been shown and described, it will be appreciated by those skilled in the art that changes may be made in these exemplary embodiments without departing from the principles and spirit of the invention, the scope of which is defined in the appended claims and their equivalents.

What is claimed is:

1. A glass frit, comprising:
    $P_2O_5$ of 10 to 25 mol %;
    $V_2O_5$ of 40 to 50 mol %;
    ZnO of 10 to 20 mol %;
    BaO of 1 to 15 mol %;
    $Sb_2O_3$ of 1 to 10 mol %;
    $Fe_2O_3$ of 1 to 10 mol %;
    $Al_2O_3$ of 0.1 to 5 mol %;
    $B_2O_3$ of 0.1 to 5 mol %;
    $Bi_2O_3$ of 1 to 10 mol %; and
    $TiO_2$ of 0.1 to 5 mol %.

2. The glass frit according to claim 1, which comprises
    $P_2O_5$ of 15 to 20 mol %;
    $V_2O_5$ of 40 to 50 mol %;
    ZnO of 10 to 20 mol %;
    BaO of 5 to 10 mol %;
    $Sb_2O_3$ of 3 to 7 mol %;
    $Fe_2O_3$ of 5 to 10 mol %;
    $Al_2O_3$ of 0.1 to 5 mol %;
    $B_2O_3$ of 0.1 to 5 mol %;
    $Bi_2O_3$ of 1 to 5 mol %; and
    $TiO_2$ of 1 to 5 mol %.

3. The glass frit according to claim 1, wherein a softening temperature (Tdsp) of the glass frit ranges from 300 to 400° C.

4. A glass frit paste composition, comprising:
    a) a glass frit according to claim 1;
    b) an organic binder; and
    c) an organic solvent.

5. The glass frit paste composition according to claim 4, comprising:
    a) said glass frit of 60 to 90 wt %;
    b) an organic binder of 0.1 to 5 wt %; and
    c) an organic solvent of 5 to 35 wt %.

6. The glass frit paste composition according to claim 4, further comprising a filler of 0.1 to 30 wt %.

7. The glass frit paste composition according to claim 4, wherein a viscosity of the paste composition ranges from 500 to 50,000 cps.

8. A sealing method for an electric element which is manufactured by sealing at least two substrates, the sealing method comprising:
    printing a glass frit paste composition according to claim 4 on a predetermined position of a substrate to be sealed; and
    sealing the substrate by melting the glass frit paste composition printed by laser.

9. The sealing method according to claim 8, wherein the electric element comprises an OLED element, further comprising:

applying a photo-curable light transparent composition to a surface of a lower substrate or an upper substrate printed with a glass frit paste composition and a getter composition connected to each other when tightly sealed;

curing the photo-curable light transparent composition by emitting light to the connected upper and lower sealing members after connecting the upper and lower sealing members having the photo-curable light transparent composition; and melting the glass frit paste composition and getter composition by laser to seal upper and lower substrates.

10. An electric element which is tightly sealed by a sealing method according to claim 8.

11. The electric element according to claim 10, wherein the electric element comprises an OLED element, a dye-sensitized solar cell (DSSC) or a light emitting diode (LED).

* * * * *